(12) United States Patent
Chang et al.

(10) Patent No.: US 12,159,912 B2
(45) Date of Patent: Dec. 3, 2024

(54) INTEGRATED CIRCUIT INCLUDING SPACER STRUCTURE FOR TRANSISTORS

(71) Applicant: Taiwan Semiconductor Manufacturing Co., Ltd., Hsinchu (TW)

(72) Inventors: Chia-Hao Chang, Hsinchu (TW); Jia-Chuan You, Hsinchu (TW); Chu-Yuan Hsu, Hsinchu (TW); Kuo-Cheng Chiang, Hsinchu (TW); Chih-Hao Wang, Hsinchu (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 376 days.

(21) Appl. No.: 17/581,784

(22) Filed: Jan. 21, 2022

(65) Prior Publication Data
US 2023/0009738 A1    Jan. 12, 2023

Related U.S. Application Data

(60) Provisional application No. 63/220,198, filed on Jul. 9, 2021.

(51) Int. Cl.
| | |
|---|---|
| H01L 29/417 | (2006.01) |
| H01L 21/8234 | (2006.01) |
| H01L 27/088 | (2006.01) |
| H01L 29/06 | (2006.01) |
| H01L 29/423 | (2006.01) |
| H01L 29/66 | (2006.01) |
| H01L 29/786 | (2006.01) |

(52) U.S. Cl.
CPC ............ *H01L 29/41775* (2013.01); *H01L 21/823468* (2013.01); *H01L 27/088* (2013.01); *H01L 29/0665* (2013.01); *H01L 29/41733* (2013.01); *H01L 29/42364* (2013.01); *H01L 29/4238* (2013.01); *H01L 29/42392* (2013.01); *H01L 29/6656* (2013.01); *H01L 29/66742* (2013.01); *H01L 29/78618* (2013.01)

(58) Field of Classification Search
CPC ......... H01L 29/41775; H01L 29/66553; H01L 21/823468; H01L 29/6656
See application file for complete search history.

(56) References Cited

U.S. PATENT DOCUMENTS

| | | |
|---|---|---|
| 9,236,267 B2 | 1/2016 | De et al. |
| 9,502,265 B1 | 11/2016 | Jiang et al. |
| 9,520,466 B2 | 12/2016 | Holland et al. |
| 9,520,482 B1 | 12/2016 | Chang et al. |

(Continued)

FOREIGN PATENT DOCUMENTS

TW      201631724 A      9/2016

*Primary Examiner* — Nduka E Ojeh
(74) *Attorney, Agent, or Firm* — Seed IP Law Group LLP

(57) ABSTRACT

An integrated circuit includes a nanosheet transistor having a plurality of stacked channels, a gate electrode surrounding the stacked channels, a source/drain region, and a source/drain contact. The integrated circuit includes a first dielectric layer between the gate metal and the source/drain contact, a second dielectric layer on the first dielectric layer, and a cap metal on the first gate metal and on a hybrid fin structure. The second dielectric layer is on the hybrid fin structure between the cap metal and the source/drain contact.

20 Claims, 13 Drawing Sheets

(56) References Cited

U.S. PATENT DOCUMENTS

| | | | |
|---|---|---|---|
| 9,536,738 B2 | 1/2017 | Huang et al. | |
| 9,576,814 B2 | 2/2017 | Wu et al. | |
| 9,608,116 B2 | 3/2017 | Ching et al. | |
| 9,786,774 B2 | 10/2017 | Colinge et al. | |
| 9,853,101 B2 | 12/2017 | Peng et al. | |
| 9,881,993 B2 | 1/2018 | Ching et al. | |
| 2020/0006569 A1* | 1/2020 | Reznicek | H01L 29/267 |
| 2021/0036121 A1* | 2/2021 | Lim | H01L 29/78696 |
| 2021/0193654 A1* | 6/2021 | Park | H01L 29/42392 |
| 2022/0416045 A1* | 12/2022 | Park | H01L 29/0673 |

* cited by examiner

INTEGRATED CIRCUIT INCLUDING SPACER STRUCTURE FOR TRANSISTORS

BACKGROUND

There has been a continuous demand for increasing computing power in electronic devices including smart phones, tablets, desktop computers, laptop computers and many other kinds of electronic devices. Integrated circuits provide the computing power for these electronic devices. One way to increase computing power in integrated circuits is to increase the number of transistors and other integrated circuit features that can be included for a given area of semiconductor substrate.

Nanosheet transistors can assist in increasing computing power because the nanosheet transistors can be very small and can have improved functionality over convention transistors. A nanosheet transistor may include a plurality of semiconductor nanosheets (e.g. nanowires, nanosheets, etc.) that act as the channel regions for a transistor. Gate terminals may be coupled to the nanosheets.

The nanosheet transistors may also include source/drain regions and corresponding source/drain contact regions. It can be difficult to isolate gate metals from the source/drain regions while maintaining desired electrical characteristics of the nanosheet transistors.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
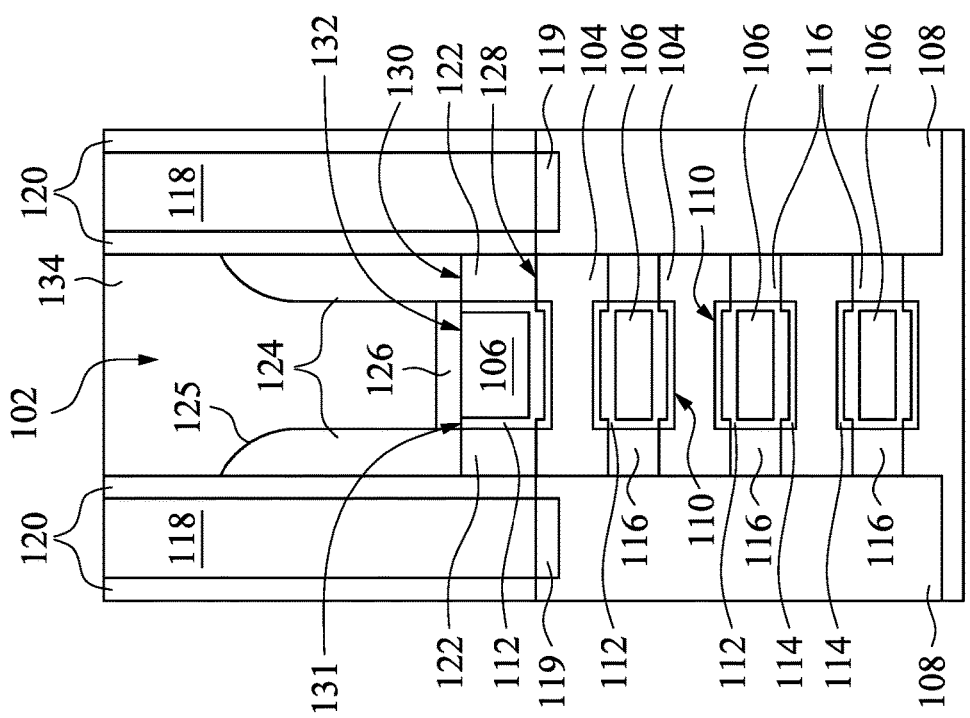
FIG. 1A is a cross-sectional view of an integrated circuit, in accordance with some embodiments.

In the following description, many thicknesses and materials are described for various layers and structures within an integrated circuit die. Specific dimensions and materials are given by way of example for various embodiments. Those of skill in the art will recognize, in light of the present disclosure, that other dimensions and materials can be used in many cases without departing from the scope of the present disclosure.

The following disclosure provides many different embodiments, or examples, for implementing different features of the described subject matter. Specific examples of components and arrangements are described below to simplify the present description. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In the following description, certain specific details are set forth in order to provide a thorough understanding of various embodiments of the disclosure. However, one skilled in the art will understand that the disclosure may be practiced without these specific details. In other instances, well-known structures associated with electronic components and fabrication techniques have not been described in detail to avoid unnecessarily obscuring the descriptions of the embodiments of the present disclosure.

Unless the context requires otherwise, throughout the specification and claims that follow, the word "comprise" and variations thereof, such as "comprises" and "comprising," are to be construed in an open, inclusive sense, that is, as "including, but not limited to."

The use of ordinals such as first, second and third does not necessarily imply a ranked sense of order, but rather may only distinguish between multiple instances of an act or structure.

Reference throughout this specification to "some embodiments" or "an embodiment" means that a particular feature, structure or characteristic described in connection with the embodiment is included in at least some embodiments. Thus, the appearances of the phrases "in some embodiments", "in an embodiment", or "in some embodiments" in various places throughout this specification are not necessarily all referring to the same embodiment. Furthermore, the particular features, structures, or characteristics may be combined in any suitable manner in one or more embodiments.

As used in this specification and the appended claims, the singular forms "a," "an," and "the" include plural referents unless the content clearly dictates otherwise. It should also be noted that the term "or" is generally employed in its sense including "and/or" unless the content clearly dictates otherwise.

Embodiments of the present disclosure provide an integrated circuit with nanosheet transistors. Each transistor includes a plurality of stacked channels and a gate metal surrounding the stacked channels. Each transistor includes a source/drain region in contact with the stacked channels and a source/drain contact over and electrically connected to the source/drain region. A first dielectric spacer layer is positioned between the gate metal and the source/drain contact. A cap metal is positioned on the gate metal and extends across a hybrid fin structure to connect the gate metal to the gate metal of another transistor. A second dielectric layer is positioned on the first dielectric layer. The second dielectric spacer layer is positioned between the cap metal and the source/drain contact over the gate metal and over the hybrid fin structure. The second dielectric spacer layer is a low-K dielectric layer.

This structure provides many benefits. The low-K second dielectric layer is used in place of high-K dielectric materials that were previously removed. The result is that parasitic capacitance is greatly reduced between the source/drain contact and the cap metal, and between adjacent source/drain contacts. This provides for faster switching of transistor states and improved characteristics of electrical signals in the source/drain contact and the cap metal.

FIG. 1 is a block diagram of an integrated circuit 100, in accordance with some embodiments. The integrated circuit 100 includes a transistor 102. The transistor 102 may include a nanosheet transistor. As will be set forth in more detail below, the transistor 102 utilizes a combination of dielectric layers to provide spacer structures that promote improved electrical characteristics for the transistor. While a single transistor 102 are shown in FIG. 1A, in practice the integrated circuit 100 may include a large number of nanosheet transistors.

The nanosheet transistors may include gate all around (GAA) transistor structures that may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in some embodiments, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

The transistor 102 includes a plurality of channels 104. The channels 104 are stacked in the vertical direction or Z direction. In the example of FIG. 1A, there are three stacked channels 104. However, in practice, there may be only two stacked channels 104 or there may be more than three stacked channels 104 without departing from the scope of the present disclosure.

The channels 104 may include one or more layers of Si, Ge, SiGe, GaAs, InSb, GaP, GaSb, InAlAs, InGaAs, GaSbP, GaAsSb or InP. Other semiconductor materials can be utilized for the channels 104 without departing from the scope of the present disclosure. In a primary non-limiting example described herein, the channels 104 are silicon. The vertical thickness of the channels 104 can be between 2 nm and 15 nm. Other thicknesses and materials can be utilized for the channels 104 without departing from the scope of the present disclosure.

The transistor 102 includes a gate metal 106. The gate metal 106 surrounds the channels 104. The gate metal 106 corresponds to a gate electrode, or they correspond to one of the metals that make up a gate electrode of the transistor 102. The gate metal 148 can include one or more of titanium nitride, tungsten, tantalum, tantalum nitride, ruthenium, cobalt, aluminum, titanium, or other suitable conductive materials. The gate metal 106 may have a height between 5 nm and 30 nm from the top surface 128 of the top channel 104. Other materials and thicknesses can be utilized for the gate metal 106 without departing from the scope of the present disclosure.

The transistor 102 includes source/drain regions 108. The source/drain regions 108 are both in contact with each of the channels 104. Each channel 104 extends in the X direction between the source/drain regions 108. The source/drain regions 108 includes semiconductor material. The source/drain regions 108 can be doped with N-type dopants species in the case of N-type transistors. The source/drain regions 108 can be doped with P-type dopant species in the case of P-type transistors. The doping can be performed in-situ during the epitaxial growth. The source/drain regions 108 can include other materials and structures without departing from the scope of the present disclosure.

The transistor 102 includes a gate dielectric 110. The gate dielectric 110 is positioned between the gate electrode 106 and the channels 104. The gate dielectric 110 surrounds the channels 104. The gate metal 106 surrounds the gate dielectric 110.

In some embodiments, the gate dielectric 110 includes a high-K gate dielectric layer 112 and a low-K gate dielectric layer 114. The low-K gate dielectric layer 114 is in contact with the channels 104. The high-K gate dielectric layer 112 is in contact with the low-K gate dielectric layer 114 and the gate metal 106. The low-K gate dielectric layer 114 is positioned between the channels 104 and the high-K gate dielectric layer 112. The low-K gate dielectric layer 114 may be termed an interfacial gate dielectric layer.

The interfacial dielectric layer 114 can include a dielectric material such as silicon oxide, silicon nitride, or other suitable dielectric materials. The interfacial dielectric layer can include a comparatively low-K dielectric with respect to high-K dielectric such as hafnium oxide or other high-K dielectric materials that may be used in gate dielectrics of transistors.

The high-K gate dielectric layer 112 includes one or more layers of a dielectric material, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The thickness of the high-k dielectric 112 is in a range from about 1 nm to about 3 nm. Other thicknesses, deposition processes, and materials can be utilized for the high-K gate dielectric layer without departing from the scope of the present disclosure. The high-K gate dielectric layer may include a first layer that includes HfO2 with dipole doping including La and Mg, and a second layer including a higher-K ZrO layer with crystallization.

The transistor 102 includes inner spacers 116. The inner spacers 116 can include silicon oxide, silicon oxynitride, silicon carbonitride, silicon oxycarbonitride, fluorine-doped silicate glass (FSG), a low-K dielectric material or other dielectric materials without departing from the scope of the present disclosure. The inner spacers 116 physically separate the gate metal 106 from the source/drain regions 108. This prevents short circuits between the gate metal 106 and the source/drain regions 107. Other materials and structures can be utilized for the inner spacers 116 without departing from the scope of the present disclosure.

The transistor 102 includes source/drain contacts 118. Each source/drain contact 118 is positioned over and electrically connected to a respective source/drain region 108. Electrical signals may be applied to the source/drain regions 108 via the source/drain contacts 118. The source/drain contacts 118 can include a conductive material such as tungsten, titanium, aluminum, tantalum, or other suitable conductive materials.

The transistor 102 includes silicide 119. The silicide 119 is formed at the top of the source/drain regions 108. The source/drain contacts 118 are positioned in contact with the silicide 119. The silicide 119 promotes good electrical connection between the source/drain contacts 118 and the source/drain regions 108. The silicide 119 can include titanium silicide, aluminum silicide, nickel silicide, tungsten silicide, or other suitable silicides.

The transistor 102 can be operated by applying voltages to the source/drain regions 108 and the gate metal 106. The voltages can be applied to the source/drain regions 108 via the source/drain contacts 118. The voltages can be applied to the gate electrode 106 via a gate contact not shown in FIG. 1A. The voltages can be selected to turn on the transistor 102 or to turn off the transistor 102. When the transistor 102 is turned on, currents may flow between the source/drain regions 108 through each of the channels 104. When the transistor 102 is turned off, currents do not flow through the channels 104.

The integrated circuit 100 includes a dielectric layer 120 extending from the top of the source/drain regions 108 along the sidewalls of the source/drain contacts 118. The dielectric layer 120 is formed on the sidewalls of the source/drain contacts 180.

The integrated circuit 100 includes a dielectric layer 122. The dielectric layer 122 is positioned on a top surface 128 of a top channel 104 of the plurality of channels 104. The dielectric layer 122 is positioned between the gate metal 106 and the source/drain contacts 118. The dielectric layer 122 is in contact with the high-K gate dielectric 112 and the dielectric layer 120.

In some embodiments, the dielectric layer 122 has a top surface 130 that is substantially coplanar with a top surface 132 of the gate metal 106. In some embodiments, the dielectric layer 122 is a top surface 130 that is substantially coplanar with a top surface 131 of the high-K gate dielectric 112. Alternatively, the top surface 130 of the dielectric layer 122 may be higher or lower than the top surface 132 of the gate metal 106.

In some embodiments, the dielectric layer 122 is a low-K dielectric material. The dielectric material of the dielectric layer 122 may be selected from a group including silicon oxide, silicon nitride, silicon carbonitride, silicon oxycarbonitride, silicon oxynitride, or other suitable dielectric materials. The height of the dielectric layer 122 in the Z direction may be between 5 nm and 30 nm from the top surface 128 of the top channel 104. The width of the dielectric layer 122 in the X direction may be between 0.5 nm and 10 nm. These heights and weights may be sufficient to provide adequate spacing between gate metal 106 and the source/drain contacts 118 while providing a low dielectric constant and robust material integrity. Furthermore, these dimensions for the dielectric layer 122 may provide a desired structure to support subsequent dielectric spacer layers. The dielectric layer 122 may be considered a gate spacer for the gate metal 106. Other materials, heights, and weights can be utilized for the dielectric layer 122 without departing from the scope of the present disclosure.

The integrated circuit 100 includes a cap metal 126 positioned on the top surface 132 of the gate metal 106. The cap metal 126 may include one or more of ruthenium, tungsten, titanium nitride, tantalum nitride, cobalt, titanium, titanium aluminum, aluminum, or other suitable conductive materials. As will be set forth in more detail below, the cap metal 126 may connect the gate metals of different transistors in the integrated circuit 100. The cap metal 126 may have a thickness between 0.5 nm and 10 nm. Other materials, configurations, and dimensions can be utilized for the cap metal 126 without departing from the scope of the present disclosure.

The integrated circuit 100 includes a dielectric layer 124. The dielectric layer 124 is positioned on a top surface 130 of the dielectric layer 122. The dielectric layer 124 is positioned between the cap metal 126 and the source/drain contacts 118. More particularly, the dielectric layer 124 may be positioned in contact with the cap metal 126 and the dielectric layer 120. The dielectric layer 120 extends higher in the Z direction than does the dielectric layer 124. The dielectric layer 124 may have a slowed or tapered upper surface 125.

The dielectric layer 124 includes a low-K dielectric material. In some embodiments, the dielectric layer 124 includes a material having a dielectric constant lower than the dielectric constant of the high-K gate dielectric 112. In some embodiments, the dielectric layer 124 has a dielectric constant less than 11. The dielectric constant with this value may be sufficient to reduce parasitic capacitances associated with source/drain contacts 118 and gate metals 106, while maintaining robust spacing properties and structural integrity. The dielectric layer 124 may be considered a spacer layer or a gate spacer layer. The dielectric layer 124 and the dielectric layer 122 together may correspond to a gate spacer.

The dielectric layer 124 may include silicon oxide, silicon nitride, silicon carbonitride, silicon oxycarbonitride, silicon oxynitride, or other suitable dielectric materials. The dielectric layer 124 may have a height in the Z direction between 5 nm and 40 nm from the top surface 130 of the dielectric layer 122. The dielectric layer 124 may have a width in the X direction between 0.5 nm and 10 nm. The top of the dielectric layer 124 may be up to 35 nm from the top of the dielectric layer 120. In some embodiments, the top of the dielectric layer 124 may be as high as the top of the dielectric layer 120. Other materials, dimensions, shapes, and configurations can be utilized for the dielectric layer 124 without departing from the scope of the present disclosure. The dielectric layer 124 may be a different material than the dielectric layer 122. Alternatively, the dielectric layer 124 may be a same material as the dielectric layer 122.

The integrated circuit 100 includes a dielectric layer 134. The dielectric layer 134 is positioned on the top and sidewalls of the dielectric layer 124. The dielectric layer 134 is positioned on the top of the cap metal 126. The dielectric layer 134 is positioned on the sidewalls of the dielectric layer 120 above the dielectric layer 124. The dielectric layer 134 fills the remaining space between the source/drain contacts 118.

The dielectric layer 134 can include silicon oxide, silicon nitride, silicon carbonitride, silicon oxycarbonitride, silicon oxynitride, or other suitable dielectric materials. The height of the dielectric layer 134 can be between 5 nm and 40 nm from the top of the dielectric layer 124. Other materials and dimensions can be utilized for the dielectric layer 134 without departing from the scope of the present disclosure.

Figure 1B:
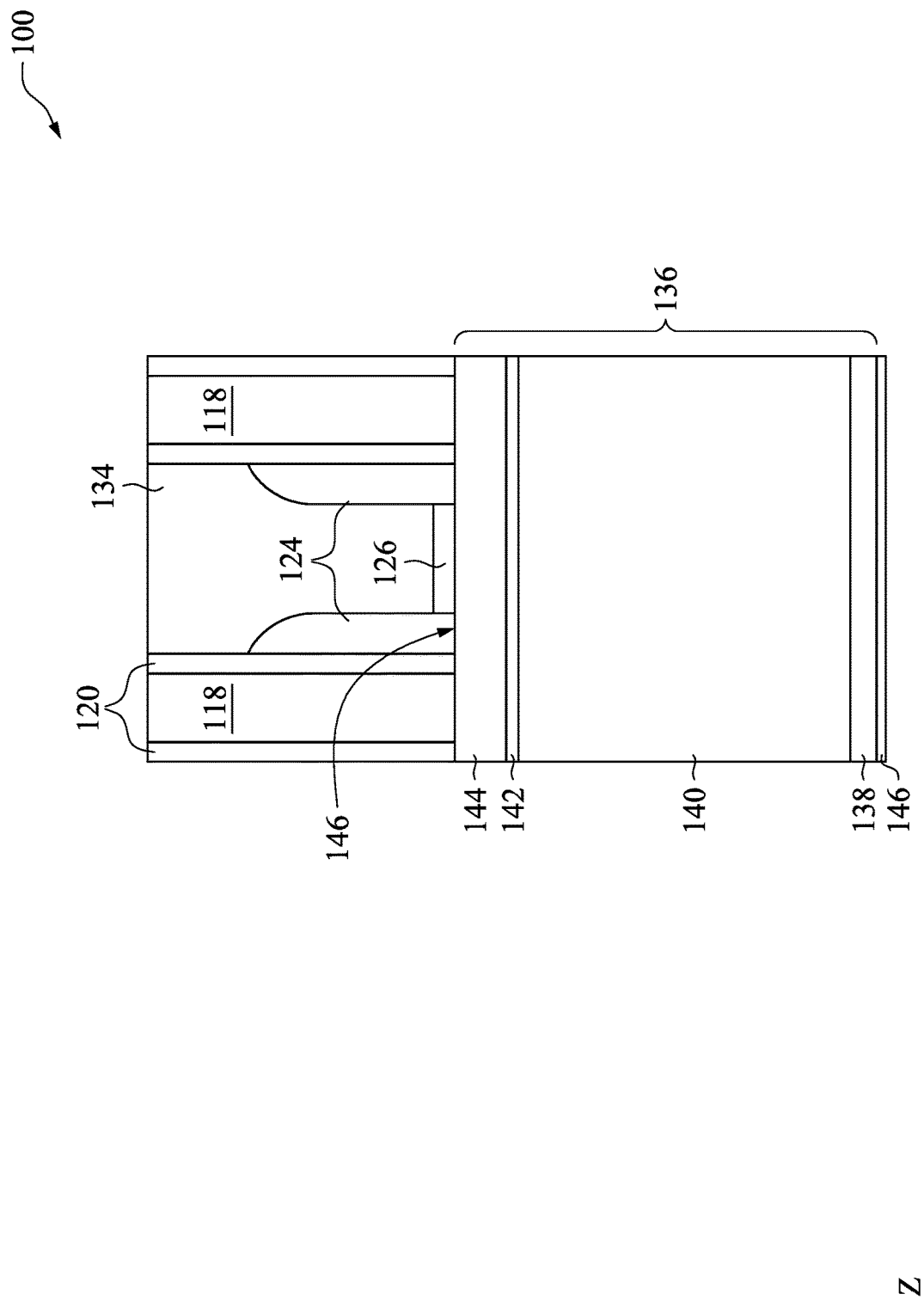
FIG. 1B is a cross-sectional view of an integrated circuit, in accordance with some embodiments.

FIG. 1B is a cross-sectional view of the integrated circuit 100 of FIG. 1A taken along a different cut line, in accordance with some embodiments. The integrated circuit 100 includes a hybrid fin structure 136. The hybrid fin structure 136 extends in the X direction. The hybrid fin structure 136 separates the source/drain regions 108 of the transistor 102 from the source/drain regions of another transistor offset from the source/drain regions 108 in the Y direction. In this case, the Y direction goes into and out of the drawing sheet.

The hybrid fin structure 136 includes a dielectric layer 138. In one example, the dielectric layer 138 includes silicon oxycarbonitride. However, the dielectric layer 138 can include silicon oxide, silicon nitride, silicon oxynitride, silicon carbonitride, fluorine-doped silicate glass (FSG), a low-K dielectric material or other dielectric materials without departing from the scope of the present disclosure.

The hybrid fin structure 136 include a dielectric layer 140 on the dielectric layer 138. In one example, the dielectric layer 140 includes silicon oxide. However, the dielectric layer 140 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure.

The hybrid fin structure 136 include a dielectric layer 142 on the dielectric layer 140. In one example, the dielectric layer 142 a high-k dielectric material. The high-k dielectric material may include hafnium oxide. The high-k dielectric material may include the same or similar composition as the high-k gate dielectric layer 112. The dielectric constant of the high-k dielectric material of the dielectric layer 142 may have a dielectric constant greater than 20.

The hybrid fin structure 136 include a dielectric layer 144 on the dielectric layer 138. In one example, the dielectric layer 144 includes silicon oxide. However, the dielectric layer 140 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure. The hybrid fin structure 136 may include other materials, structures, and compositions without departing from the scope of the present disclosure.

The hybrid fin structure 136 may be positioned on the shallow trench isolation structure 146. In one example, the trench isolation regions 146 includes silicon oxide. However, the shallow trench isolation regions 146 can include silicon nitride, silicon oxynitiide, carbonitride, silicon oxycarbonitride, fluorine-doped silicate glass (FSG), or a low-K dielectric material.

The cap metal 126 is positioned on the top surface 146 of the hybrid fin structure 136. More particularly, the cap metal 126 is positioned on the top surface of the dielectric layer 144. The capital 126 extends across the hybrid fin structure 136 in the Y direction from the gate metal 106 of the transistor 102 to connect to the gate metal from another transistor. The source/drain contacts 118 also extends across the hybrid fin structure 136 in the Y direction from the source/drain regions 108 of the transistor 102 to the source/drain regions of the other transistor on the other side of the hybrid fin structure 136.

The dielectric layer 124 is also positioned on the top surface 146. The dielectric layer 124 is positioned between the Metal layer 126 and the source/drain contacts 118. In some embodiments, the dielectric layer 124 is in contact with the cap metal 126 and the dielectric layer 120 on the hybrid fin structure 136.

As described previously, the dielectric layer 124 is a low-K dielectric material, with the dielectric constant less than 11 and significantly less than the dielectric constant of the high-K dielectric layer 142. One possible configuration of the integrated circuit 100 is to have a portion of the space between the cap metal 126 and the dielectric layer 120 filled by a high-K dielectric material of the same material as the high-K dielectric layer 142. However, this results in a relatively large parasitic capacitance between the capital 126 and the source/drain contacts 118. This can adversely affect the switching speeds of transistors of the integrated circuit 100 and can otherwise degrade signal transmission through the capital 126 and the source/drain contacts 118.

Advantageously, in the integrated circuit 100 the gap between the capital 126 and the dielectric layer 120 is filled entirely by the low-K dielectric layer 124. This results in low parasitic capacitances between the source/drain contacts 118 and the capital 126. This results in higher switching speeds for transistors of the integrated circuit 100. This results in superior overall signal transmission and propagation characteristics in the integrated circuit 100. Though not apparent in FIG. 1B, the top surface of the hybrid fin structure 136 may be substantially coplanar with the top surface 132 of the gate metal 122.

FIGS. 2A-2H are perspective views of an integrated circuit 100 and various stages of processing, in accordance with some embodiments. FIGS. 2A-H illustrate example processes for forming the integrated circuit 100 of FIGS. 1A and 1B. Variations can be made to the processes, structures, materials, and components shown and described in relation to FIGS. 2A-2H without departing from the scope of the present disclosure.

Figure 2A:
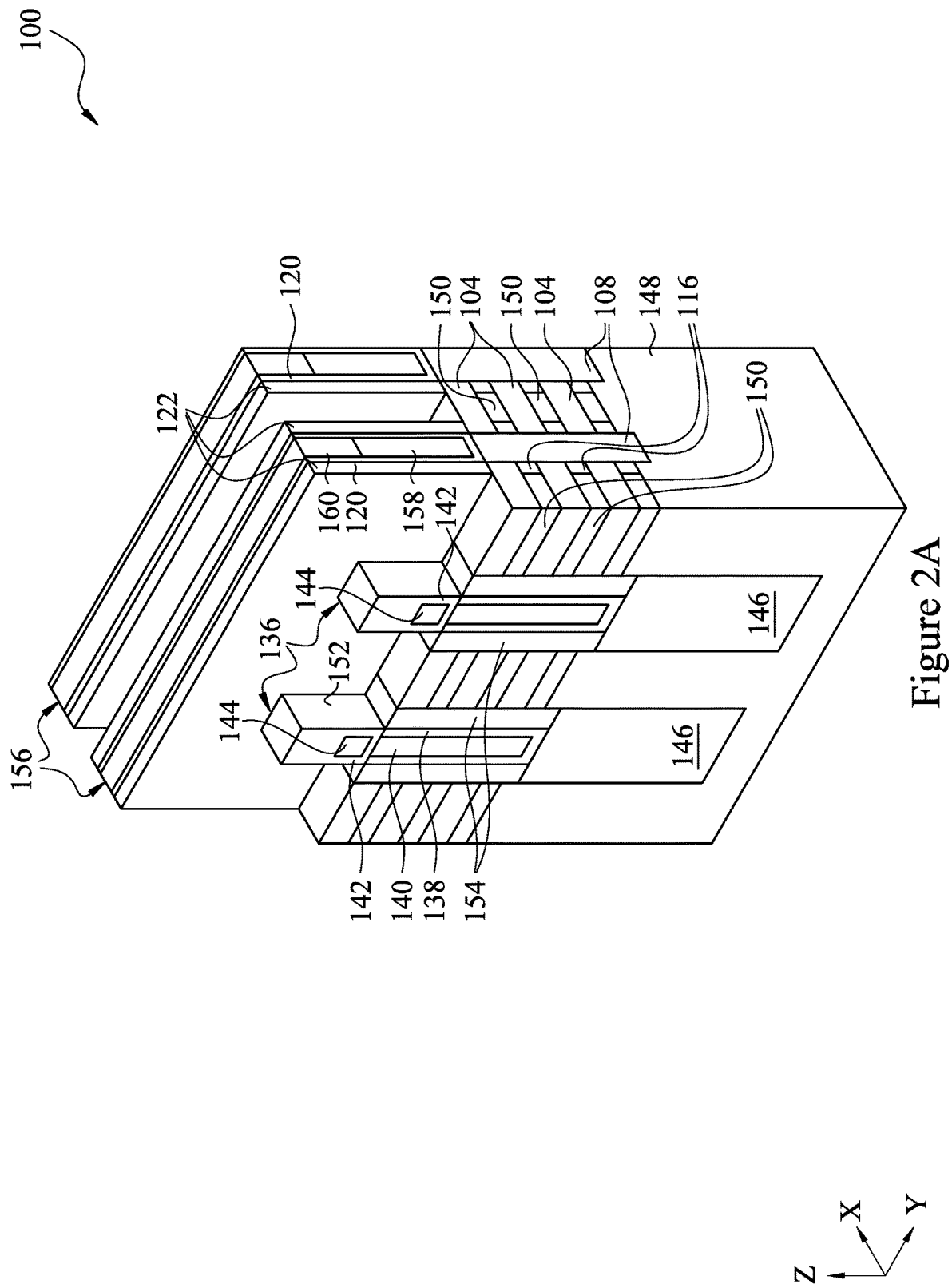
FIGS. 2A-2J are perspective and cross-sectional views of an integrated circuit at various stages of processing, in accordance with some embodiments.

In FIG. 2A, the integrated circuit 100 includes a substrate 148. The semiconductor material may include a single crystalline semiconductor layer on at least a surface portion. The substrate 148 may include a single crystalline semiconductor material such as, but not limited to Si, Ge, SiGe, GaAs, InSb, GaP, GaSb, InAlAs, InGaAs, GaSbP, GaAsSb and InP. In an example process described herein, the first semiconductor material includes Si, though other semiconductor materials can be utilized without departing from the scope of the present disclosure.

The substrate 148 may include in its surface region one or more buffer layers (not shown). The buffer layers can serve to gradually change the lattice constant from that of the substrate to that of the source/drain regions. The buffer layers may be formed from epitaxially grown single crystalline semiconductor materials such as, but not limited to Si, Ge, GeSn, SiGe, GaAs, InSb, GaP, GaSb, InAlAs, InGaAs, GaSbP, GaAsSb, GaN, GaP, and InP. The substrate 148 may include various regions that have been suitably doped with impurities (e.g., p-type or n-type conductivity). The dopants are, for example boron ($BF_2$) for an n-type transistor and phosphorus for a p-type transistor.

In some embodiments, the integrated circuit 100 includes shallow trench isolation regions 146 formed in the substrate 148. In one example, the trench isolation regions 146 includes silicon oxide. However, the shallow trench isolation regions 146 can include silicon nitride, silicon oxynitride, silicon carbonitride, silicon oxycarbonitride, fluorine-doped silicate glass (FSG), or a low-K dielectric material. The shallow trench isolation regions 146 can be formed in conjunction with formation of the fins 156. For example, the fins 156 may be formed by forming the various layers of the fins 156, forming a mask on the semiconductor layer 114, and then performing an etching process in the presence of the mask that defines the tins 156 and etches away a portion of the semiconductor material of the substrate 148. The portions of the substrate 148 can then be replaced by depositing the material of the shallow trench isolation regions 146. Other materials and structures can be utilized for the shallow trench isolation regions 146 without departing from the scope of the present disclosure.

The integrated circuit 100 includes a plurality of stacked channels 104 and a plurality of sacrificial semiconductor layers 150. The stacked channels 104 are layers of semiconductor material. The sacrificial semiconductor layers 150 are also layers of semiconductor material. The semiconductor material of the sacrificial semiconductor layers 150 is selectively etchable with respect to the semiconductor material of the stacked channels 104. As will be set forth in more detail below, each distinct set of stacked channels 104 will correspond to the stacked channels of a nanosheet transistor. The sacrificial semiconductor layers 150 will eventually be removed so that gate dielectric materials and gate metal materials may surround each individual stacked channel 104.

The stacked channels 104 may include one or more layers of Si, Ge, SiGe, GaAs, InSb, GaP, GaSb, InAlAs, InGaAs, GaSbP, GaAsSb or InP. In one example, the stacked channels 104 are the same semiconductor material as the semiconductor material. Other semiconductor materials can be utilized for the stacked channels 104 without departing from the scope of the present disclosure. In a primary non-limiting example described herein, the stacked channels 104 and the semiconductor material are silicon.

The sacrificial semiconductor layers 150 include a different semiconductor material than the stacked channels 104. In an example in which the stacked channels 104 include silicon, the sacrificial semiconductor layers 150 may include SiGe. In one example, the silicon germanium sacrificial semiconductor layers 150 may include between 20% and 30% germanium, though other concentrations of germanium can be utilized without departing from the scope of the present disclosure.

In some embodiments, the stacked channels 104 and the sacrificial semiconductor layers 150 are formed by alternating epitaxial growth processes from the semiconductor substrate 148. For example, a first epitaxial growth process may result in the formation of the lowest sacrificial semiconductor layer 150 on the top surface of the substrate 148. A second epitaxial growth process may result in the formation of the lowest stacked channel 104 on the top surface of the lowest sacrificial semiconductor layer 150. Alternating epitaxial growth processes are performed until a selected number of stacked channels 104 and sacrificial semiconductor layers 150 have been formed. While FIG. 2A illustrates two stacked channels 104 and two sacrificial semiconductor layers 150 in each fin, in practice, there may be more than two stacked channels 104 and sacrificial semiconductor layers 150.

The vertical thickness of the stacked channels 104 can be between 2 nm and 15 nm. The thickness of the sacrificial semiconductor layers 150 can be between 5 nm and 15 nm. Other thicknesses and materials can be utilized for the stacked channels 104 and the sacrificial semiconductor layers 150 without departing from the scope of the present disclosure.

The transistor 102 includes inner spacers 116. The inner spacers 116 can include silicon oxide, silicon oxynitride, silicon carbonitride, silicon oxycarbonitride, fluorine-doped silicate glass (FSG), a low-K dielectric material or other dielectric materials without departing from the scope of the present disclosure. The inner spacers 116 physically separate the gate metal 106 from the source/drain regions 108. This prevents short circuits between the gate metal 106 and the source/drain regions 107. Other materials and structures can be utilized for the inner spacers 116 without departing from the scope of the present disclosure. The inner spacers 116 can initially be formed in recesses in the sacrificial semiconductor layers 150 between channels 104.

The integrated circuit includes hybrid fin structures 136 and sacrificial spacers 154 on either side of the hybrid fin structures 136. The sacrificial spacers 154 separate the hybrid fin structures 136 from the channels 104 and the sacrificial semiconductor layers 150. The sacrificial spacers 154 may include a material that is selectively etchable with respect to the channels 104. The sacrificial spacers 154 may include a same material as the sacrificial semiconductor layers 150. In an example in which the channels 104 include silicon, the sacrificial spacers 154 may include silicon germanium. Other materials may be utilized for the sacrificial spacers 154 without departing from the scope of the present disclosure.

The hybrid fin structure 136 extends in the X direction. The hybrid fin structure 136 separates the source/drain regions 108 of the transistor 102 from the source/drain regions of another transistor offset from the source/drain regions 108 in the Y direction. In this case, the Y direction goes into and out of the drawing sheet.

The hybrid fin structure 136 includes a dielectric layer 138. In one example, the dielectric layer 138 includes silicon oxycarbonitride. However, the dielectric layer 138 can include silicon oxide, silicon nitride, silicon oxynitride, carbonitride, fluorine-doped silicate glass (FSG), a low-K dielectric material or other dielectric materials without departing from the scope of the present disclosure.

The hybrid fin structure 136 include a dielectric layer 140 on the dielectric layer 138. In one example, the dielectric layer 140 includes silicon oxide. However, the dielectric layer 140 can include silicon oxide, silicon nitride, silicon oxynitride, silicon carbonitride, silicon oxycarbonitride, fluorine-doped silicate glass (FSG), a low-K dielectric material or other dielectric materials without departing from the scope of the present disclosure.

The hybrid fin structure 136 include a dielectric layer 142 on the dielectric layer 140. In one example, the dielectric layer 142 a high-k dielectric material. The high-k dielectric material may include hafnium oxide. The high-k dielectric material may include the same or similar composition as the high-k gate dielectric layer 112. The dielectric constant of the high-k dielectric material of the dielectric layer 142 may have a dielectric constant greater than 20.

The hybrid fin structure 136 include a dielectric layer 144 on the dielectric layer 138. In one example, the dielectric layer 144 includes silicon oxide. However, the dielectric layer 140 can include silicon oxide, silicon nitride, silicon oxynitride, silicon carbonitride oxycarbonitride, fluorine-doped silicate glass (FSG), a low-K dielectric material or other dielectric materials without departing from the scope of the present disclosure. The hybrid fin structure 136 may include other materials, structures, and compositions without departing from the scope of the present disclosure.

The hybrid fin structure 136 include a dielectric layer 152 on the dielectric layer 140. In one example, the dielectric layer 152 a high-k dielectric material. The high-k dielectric material may include hafnium oxide. The high-k dielectric material may include the same or similar composition as the high-k gate dielectric layer 142. The dielectric constant of the high-k dielectric material of the dielectric layer 152 may have a dielectric constant greater than 20.

The integrated circuit 100 includes fin structures 156. The fin structures 156 include a dielectric layer 122 on each side of the fin structures 156. In some embodiments, the dielectric layer 122 is a low-K dielectric material. The dielectric material of the dielectric layer 122 may be selected from a group including silicon oxide, silicon nitride, silicon carbonitride, silicon oxycarbonitride, silicon oxynitride, or other suitable dielectric materials.

The fin structures 156 include a dielectric layer 120. The dielectric layer 120 can include silicon nitride, silicon oxide, silicon oxynitride, silicon carbonitride, silicon oxycarbonitride, FSG, a low-K dielectric material, or other dielectric materials.

The fin structures 156 can include a dielectric layer 158. The dielectric layer 158 can include silicon nitride, silicon oxide, silicon oxynitride, silicon carbonitride, silicon oxycarbonitride, FSG, a low-K dielectric material, or other dielectric materials.

The fin structures 156 include a dielectric layer 160. The dielectric layer 160 include silicon nitride, silicon oxide, silicon oxynitride, silicon carbonitride, silicon oxycarbonitride, FSG, a low-K dielectric material, or other dielectric materials.

The integrated circuit 110 includes source/drain regions 108. The source/drain regions 108 includes semiconductor material. The source/drain regions 108 are each formed in contact with adjacent stacked channels 104 and inner spacers 142. The source/drain regions 108 are also delimited by the hybrid fin structures 136. The source/drain regions 108 can be epitaxially grown from one or both of the stacked channels 104 and the substrate 148. The source/drain regions 108 can be doped with N-type dopants species in the case of N-type transistors. The source/drain regions 108 can be doped with P-type dopant species in the case of P-type transistors. The doping can be performed in-situ during the epitaxial growth. The hybrid fin structures 136 can act as electrical isolation between the source/drain regions 108 of adjacent transistors.

At the stage of processing at FIG. 2A, the polysilicon material has been removed from between the fin structures 156 above the channels 104. This is to enable the formation of the gate dielectric 110 and the gate metal 156, as will be described in more detail below.

Figure 2B:
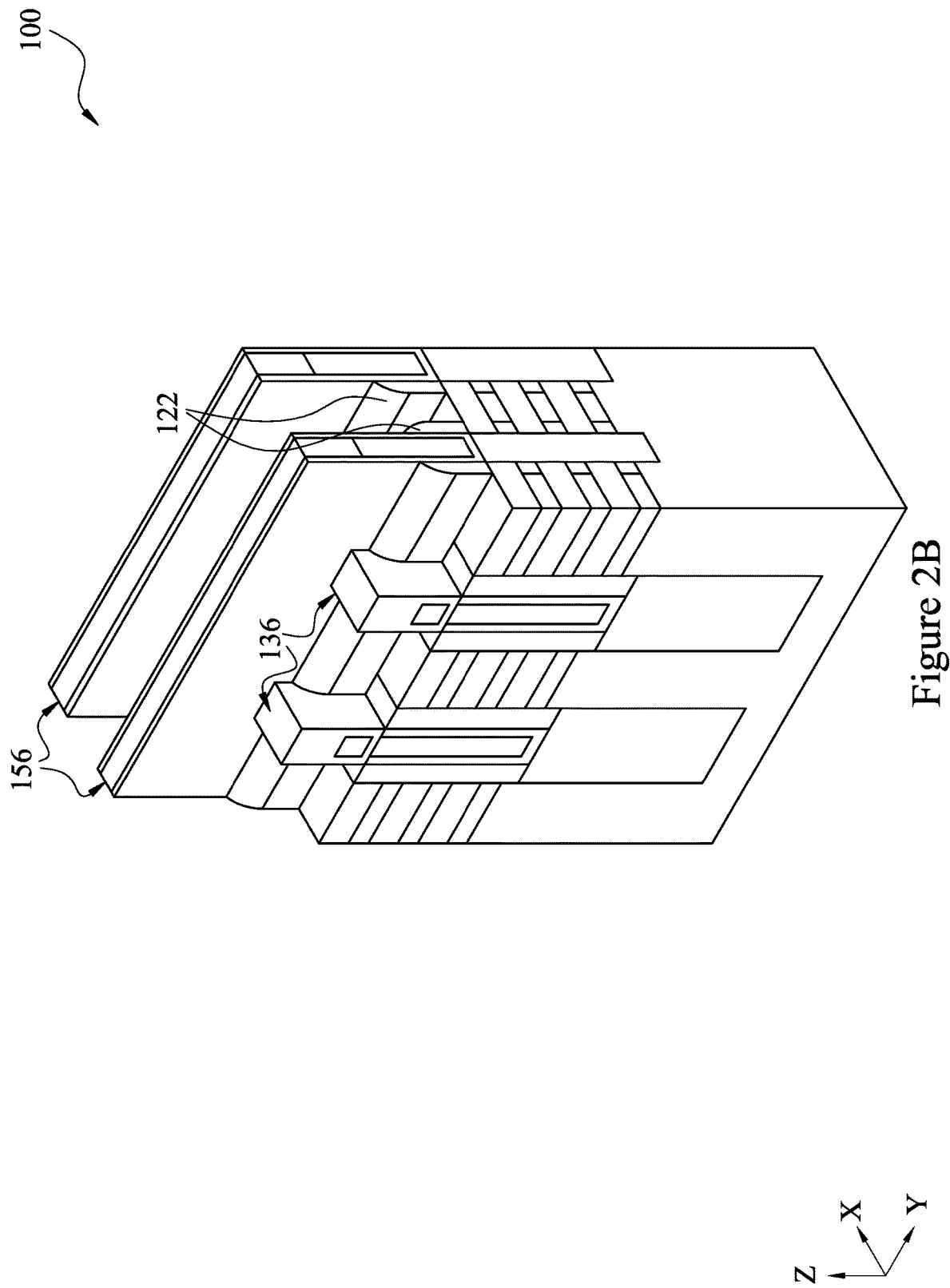

In FIG. 2B, an etch-back process has been performed to etch-back the dielectric layer 122. As described previously, the dielectric layer 122 may include a low-K dielectric spacer layer. The etch-back process can include a wet etch, a dry etch, or other suitable etching processes. The result of the etch-back process is that the dielectric layer 122 is recessed so that a top of the dielectric layer 122 is lower than the tops of the hybrid fins 136 as shown in FIG. 2B.

Figure 2C:
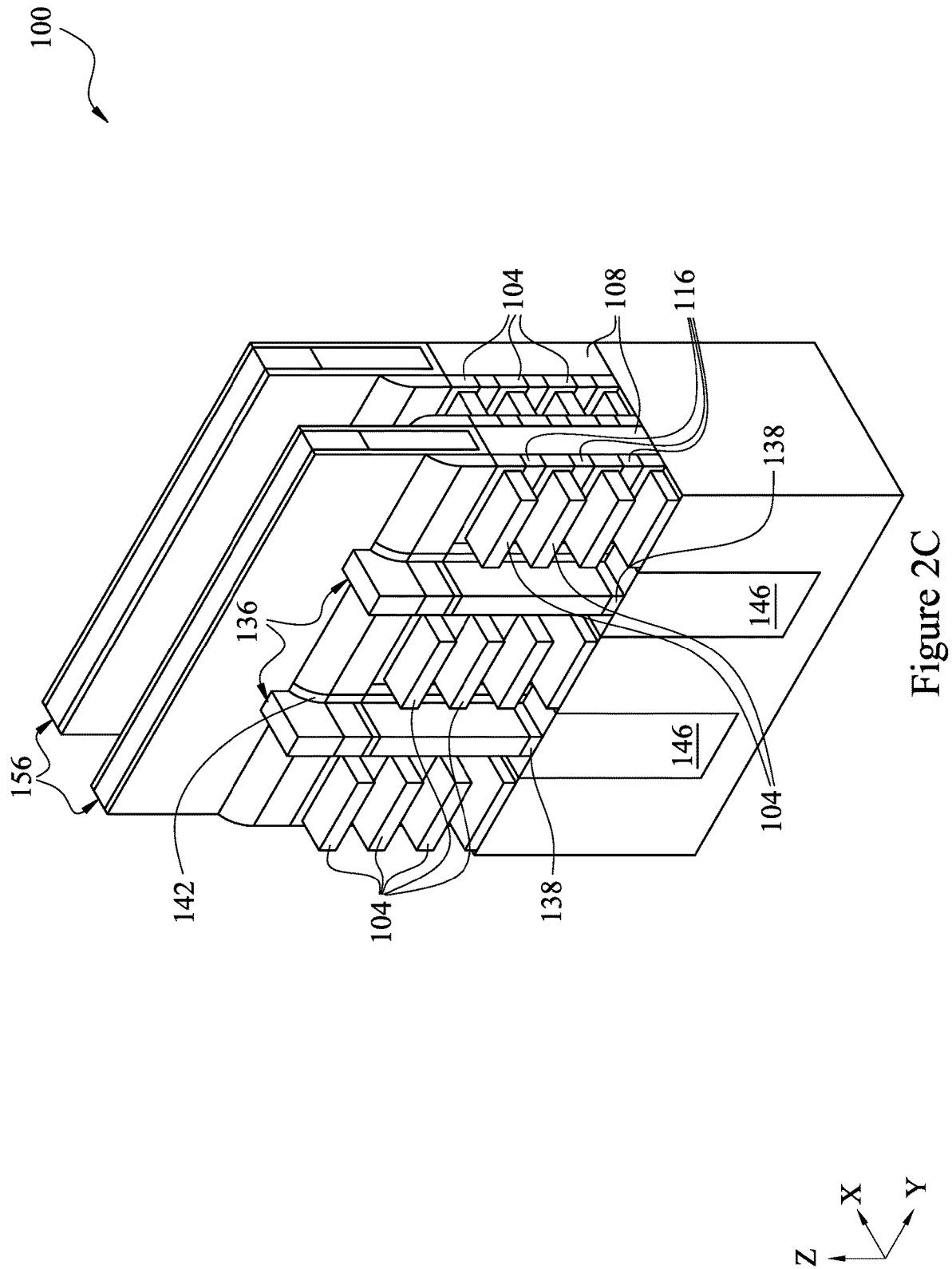

In FIG. 2C, and etching processes been performed to remove the sacrificial spacers 154 and the sacrificial semiconductor layers 150. The etching process can include a wet etch, a dry etch, or other etching processes. The etching process selectively removes the material of the sacrificial spacers 154 and the sacrificial semiconductor layers 150 with respect to the channels 104. The etching process also removes a portion of the hybrid fins 136. In particular, portions of the dielectric layers 152, 142, and 138 have been removed. The channels 104 are now free so that gate dielectrics 110 and gate metals 106 can be deposited surrounding the channels 104, as will be described in more detail below.

Figure 2D:
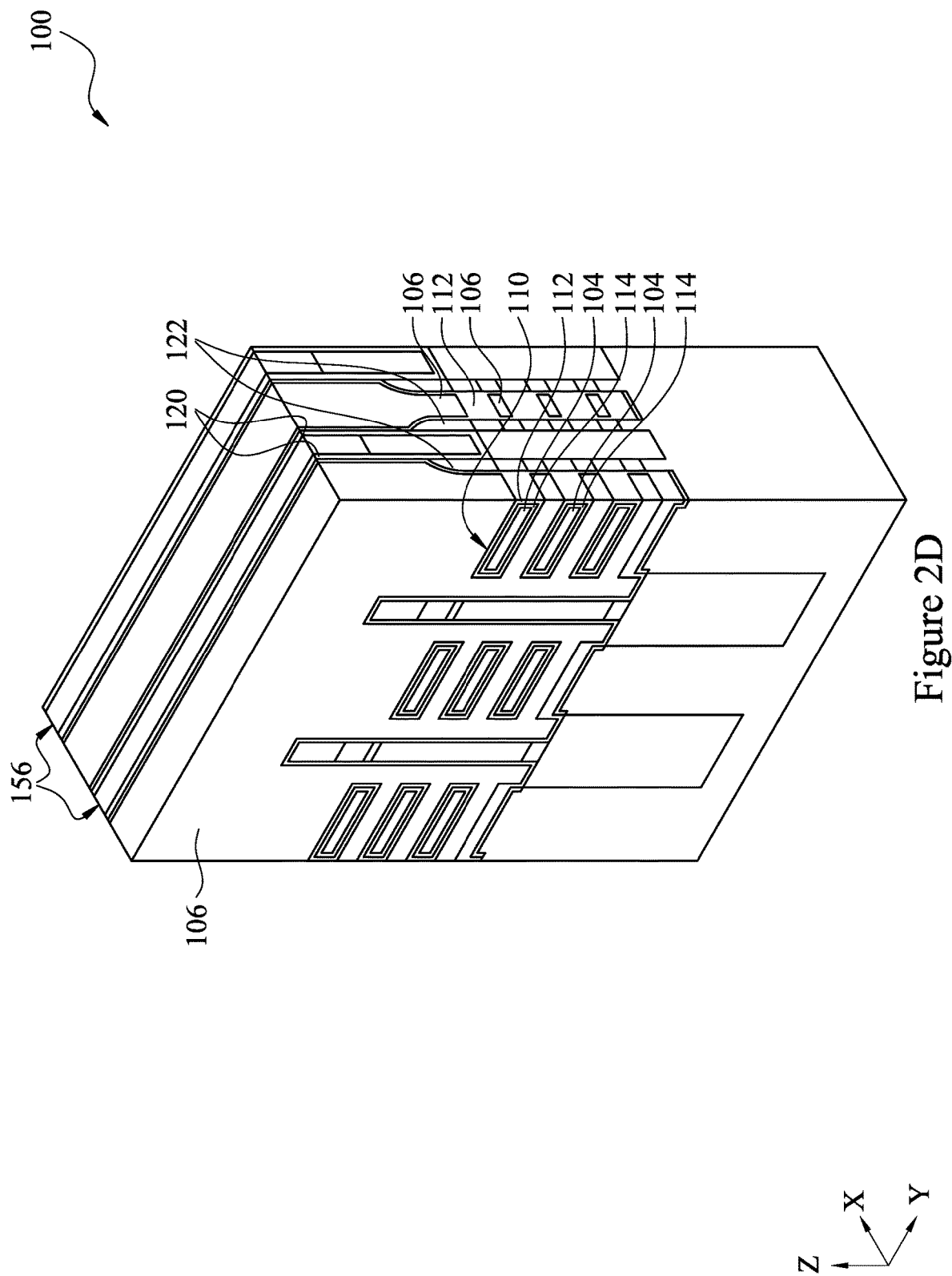

In FIG. 2D, a gate dielectric 110 has been formed surrounding the channels 104.

The gate dielectric 110 is shown as only a single layer. However, in practice, the gate dielectric 110 may include multiple dielectric layers. For example, the gate dielectric 110 may include an interfacial dielectric layer 114 that is in direct contact with the channels 104. The gate dielectric 110 may include a high-K gate dielectric layer 112 positioned on the interfacial dielectric layer 114. Together, the interfacial dielectric layer 114 and the high-K gate dielectric layer 112 form a gate dielectric 110 for the transistors that will be formed with the channels 104.

The interfacial dielectric layer 114 can include a dielectric material such as silicon oxide, silicon nitride, or other suitable dielectric materials. The interfacial dielectric layer 114 can include a comparatively low-K dielectric with respect to high-K dielectric such as hafnium oxide or other high-K dielectric materials that may be used in gate dielectrics of transistors.

The interfacial dielectric layer 114 can be formed by a thermal oxidation process, a chemical vapor deposition (CVD) process, or an atomic layer deposition (ALD) process. The interfacial dielectric layer can have a thickness between 0.5 nm and 2 nm. Other materials, deposition processes, and thicknesses can be utilized for the interfacial dielectric layer without departing from the scope of the present disclosure.

The high-K gate dielectric layer 112 and the interfacial dielectric layer 114 physically separate the channels 104 from the gate metal 106. The high-K gate dielectric layer 112 and the interfacial dielectric layer 114 isolate the gate metal 106 from the channels 104 that correspond to the channel regions of the transistors.

The high-K gate dielectric layer 112 can include one or more layers of a dielectric material, such as $HfO_2$, HfSiO, HfSiON, HfTaO, HfSiO, HfZrO, zirconium oxide, aluminum oxide, titanium oxide, hafnium dioxide-alumina ($HfO_2$—$Al_2O_3$) alloy, other suitable high-k dielectric materials, and/or combinations thereof. The high-K gate dielectric layer 112 may be formed by CVD, ALD, or any suitable method. In some embodiments, the high-K gate dielectric layer 112 may be formed using a highly conformal deposition process such as ALD in order to ensure the formation of a gate dielectric layer having a uniform thickness around each channel 104. In some embodiments, the thickness of the high-k dielectric is in a range from about 1 nm to about 3 nm. Other thicknesses, deposition processes, and materials can be utilized for the high-K gate dielectric layer without departing from the scope of the present disclosure. The high-K gate dielectric layer 112 may include a first layer that includes HfO2 with dipole doping including La and Mg, and a second layer including a higher-K ZrO layer with crystallization.

After deposition of the gate dielectric 110, a gate metal 106 is deposited. The gate metal forms a gate electrode around the semiconductor nanosheets 106 of the transistor 102. The gate metal 106 is in contact with the gate dielectric 110. The gate metal 106 is positioned between channels 104. In other words, the gate metal 106 is positioned all around the channels 104. For this reason, the transistors formed in relation to the channels 104 may be called gate all around transistors. The gate metal 106 can include one or more of titanium nitride, tungsten, tantalum, tantalum nitride, ruthenium, cobalt, aluminum, titanium, or other suitable conductive materials. The gate metal 106 can be deposited by PVD, CVD, or ALD.

Although the gate metal 106 is shown as a single metal layer, in practice, the gate metal 106 may include multiple metal layers. For example, the gate metal 106 may include one or more very thin work function layers in contact with the gate dielectric 110. The thin work function layers can include titanium nitride, tantalum nitride, or other conductive materials suitable for providing a selected work function for the transistors. The gate metal 106 can further include a gate fill material that corresponds to the majority of the gate electrodes. The gate fill material can include cobalt, tungsten, aluminum, or other suitable conductive materials. After deposition of the gate metal 106, a CMP process can be performed to planarize the top of the gate metal 106 with other structures of the integrated circuit 100.

Figure 2E:
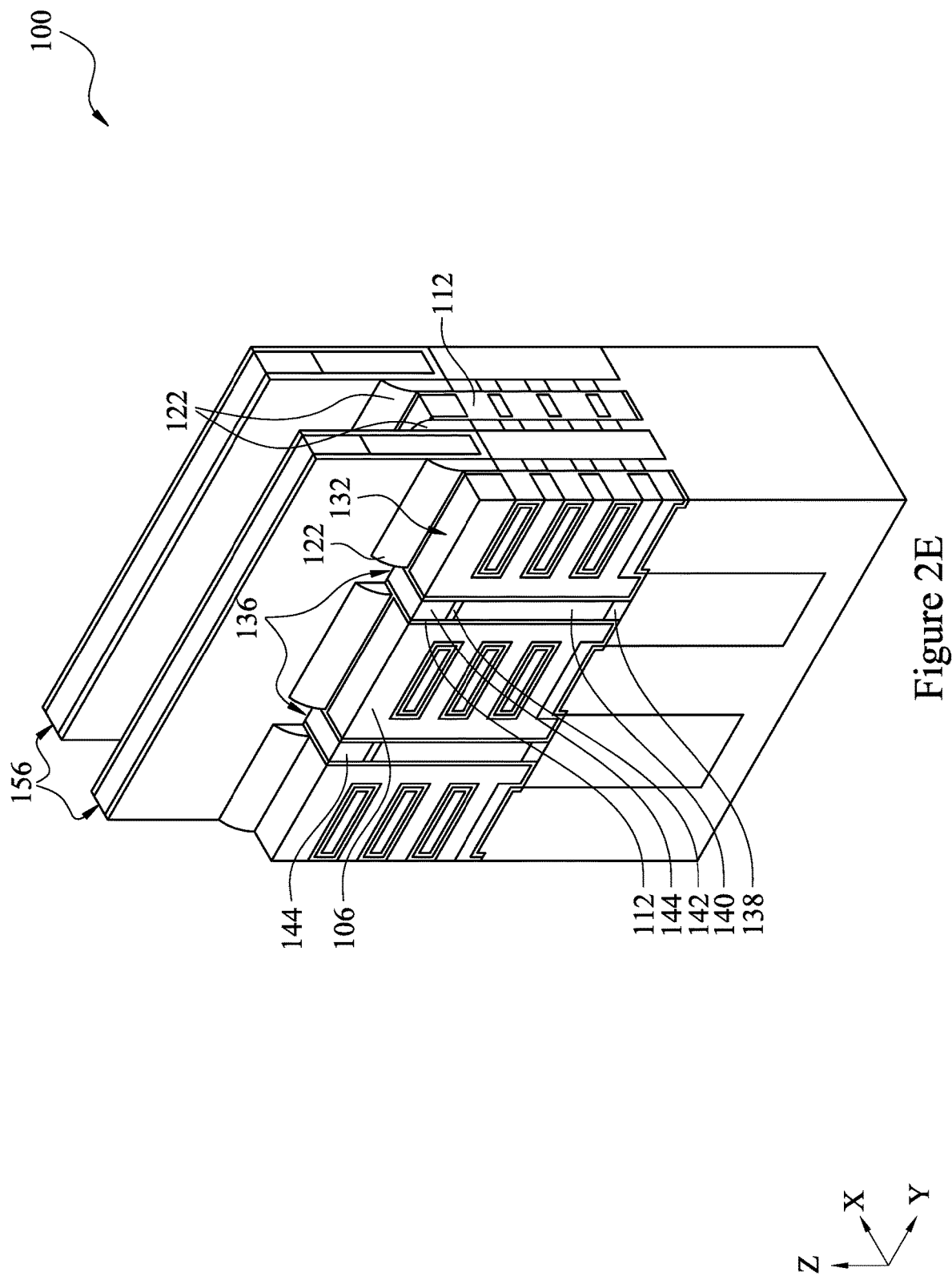

In FIG. 2E, the integrated circuit 100 and etch-back process has been performed. The etch-back process etches back the gate metal 106, the high-K gate dielectric 112, and the hybrid fin structures 136. The etch-back process can be accomplished utilizing a single etching step or combination of etching steps to etch the various materials. The etch-back process can utilize etching stop selectively etch the materials of the gate metal 106, the high-K gate dielectric layer 112, and the dielectric layer 152 with respect to the materials of the dielectric layer 122 and the fin structures 156. The etch-back process can use wet etches, dry etches, or other etching processes. The etch-back process may utilize the dielectric layer 144 of the hybrid fin structures 136 as an etch stop. In the stage of processing of FIG. 2D, the dielectric layer 122 extends higher in the Z direction than does the gate metal 106.

Figure 2F:
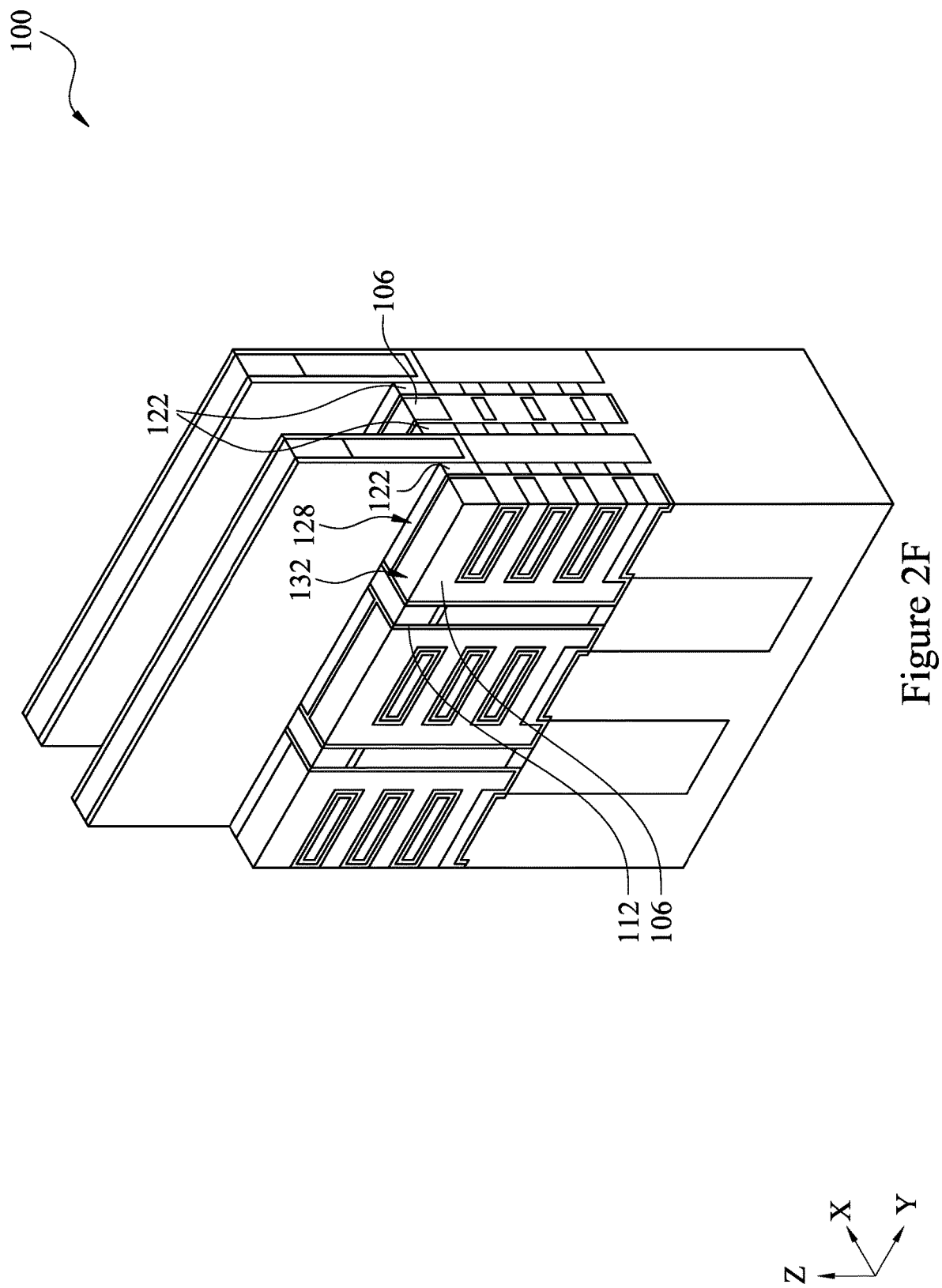

In FIG. 2F, an etch-back process has been performed. The etch-back process falls back to the dielectric layer 122 such that the top surface 130 of the dielectric layer 122 is substantially coplanar with the top surface 132 of the gate metal 106 and the top surface of the high-K gate dielectric 112. The etch-back process can include one or more etching steps selectively etch the dielectric layer 122 with respect to the other exposed materials of the integrated circuit 100.

Figure 2G:
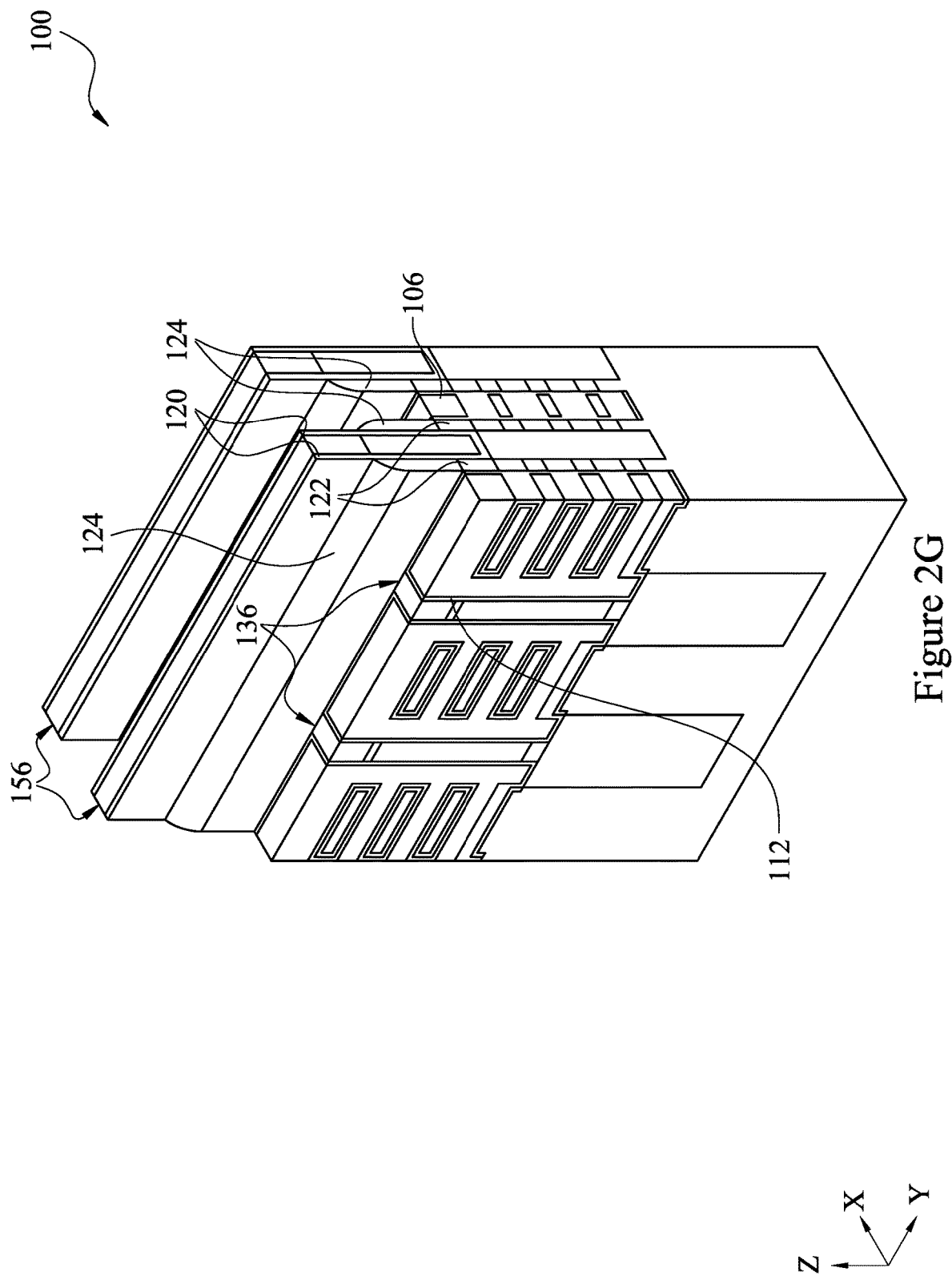

In FIG. 2G, the dielectric layer 124 has been formed. The dielectric layer 124 may include a low-K dielectric material. The dielectric constant of the dielectric layer 124 is less than the dielectric constant of the high-K gate dielectric layer 112. In some embodiments, the dielectric constant of the dielectric layer 124 is less than 11. The dielectric layer 124 may include silicon nitride, silicon oxide, silicon oxynitride, silicon carbonitride, silicon oxycarbonitride, FSG, a low-K dielectric material, or other dielectric materials. The dielectric layer 124 may be deposited by CVD, ALD, PVD, or other suitable dielectric processes. Other materials and deposition processes may be utilized for the dielectric layer 124 without departing from the scope of the present disclosure.

In some embodiments, the dielectric layer 124 may initially be deposited in a conformal deposition. After initial deposition, the dielectric layer 124 may cover the tops of the fin structures 156, the top of the gate metal 106, and the top of the hybrid fin structures 136. An anisotropic etching process may then be performed to etch the dielectric layer 124 in the downward direction. This removes the dielectric layer 124 from the tops of the fin structures 156, the gate metal 106, and the hybrid fin structures 136. The anisotropic etching process also removes the dielectric layer 124 from the upper sidewalls of the dielectric layer 120. The anisotropic etching process may also produce a sloped, tapered, or curved upper portion of the dielectric layer 124.

Figure 2H:
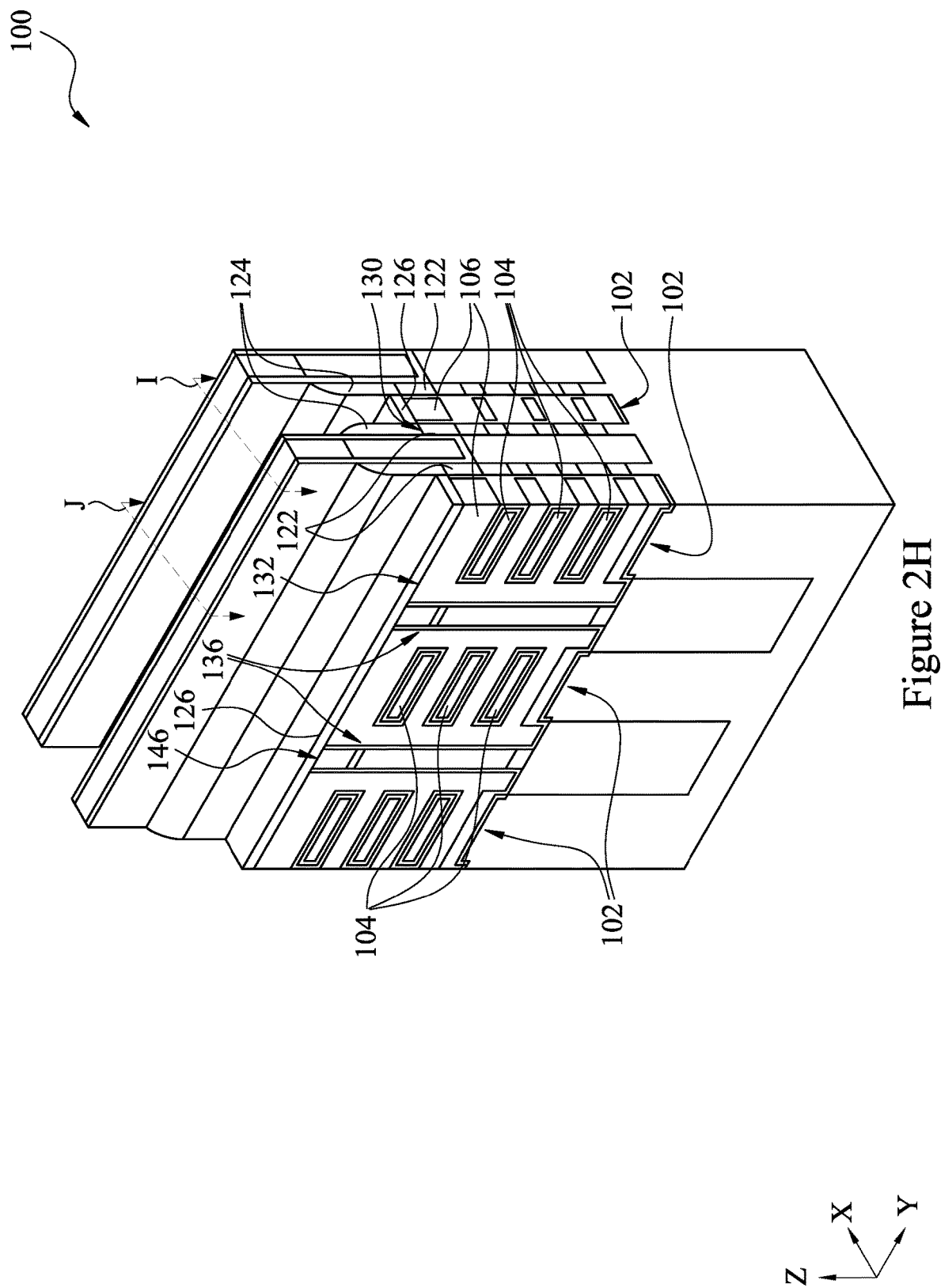

In FIG. 2H, a cap metal 126 has been deposited on the top surface 132 of the gate metal 106 and on the top surface 146 of the hybrid fin structures 136. The cap metal 126 extends across the hybrid fin structures 136 and electrically connects the gate metals 106 of adjacent transistors 102. The view of FIG. 2H illustrates four transistors 102 each corresponding to a discreet set of channels 104. The cap metal 126 may be deposited include ruthenium, tungsten, titanium nitride, tantalum nitride, copper, titanium, titanium aluminum, or other suitable conductive materials. The cap metal 126 may have a thickness between 0.5 nm and 10 nm. The cap metal 126 may be deposited by PVD, ALD, CVD, or other suitable deposition processes. The cap metal 126 may be initially deposited on all surfaces of the integrated circuit 100 and then may be etched so that the cap metal 126 only remains on the gate metal 106 and the hybrid fin structures 136. Other materials, dimensions, and deposition processes may be utilized to form the cap metal 126 without departing from the scope of the present disclosure.

Figure 2I:
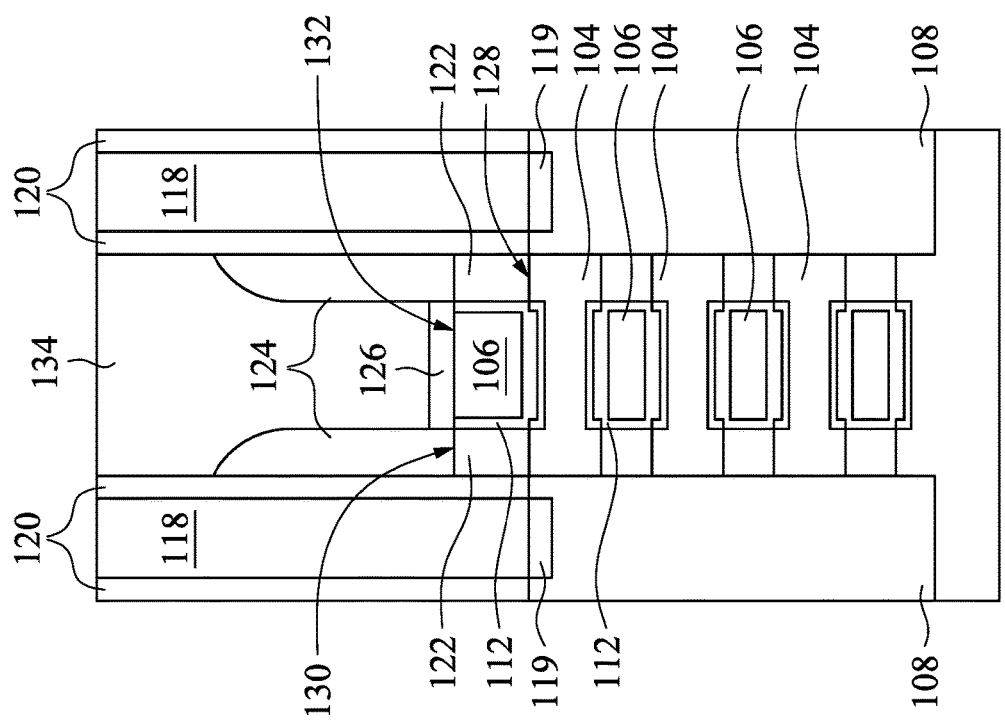

FIG. 2I is a cross-sectional view of the integrated circuit 100 taken along cut lines I in FIG. 2H. The structure of FIG. 2I is the structure shown in FIG. 1A. In FIG. 2I, the silicide 119 and the source/drain contacts 118 have been formed, though this is not shown in FIG. 2H. Formation of the silicide 119 and the source/drain contacts 118 can include removal of the dielectric layers 158 and 160, as well as the bottom of the dielectric layer 120 as to expose the source/drain regions 118 and the tops of the hybrid fin structures 136. After removal of the dielectric layers 158 and 160, and the bottom portion of the dielectric layer 120, the silicide 119 can be formed on the source/drain regions 108. The silicide 119 can include titanium silicide, aluminum silicide, nickel silicide, tungsten silicide, or other suitable silicides.

After formation of the silicide 119, source/drain contacts 118 are formed on the silicide 119. The source/drain contacts 118 can include a conductive material such as tungsten, titanium, aluminum, tantalum, or other suitable conductive materials. The source/drain contacts 118 provide electrical connections to the source/drain regions 108. Voltages can be applied to the source/drain regions 108 via the source/drain contacts 118. The source/drain contacts can be formed by PVD, ALD, CVD, or other suitable deposition processes.

The dielectric layer 134 has been deposited on the dielectric layer 124, on the top of the cap metal 126, and on the sidewalls of the dielectric layer 120. The dielectric layer 134 fills the remaining space between the source/drain contacts 118 above the channels 104. The dielectric layer 134 can include silicon nitride, silicon oxide, silicon oxynitride, silicon carbonitride, silicon oxycarbonitride, FSG, a low-K dielectric material, or other dielectric materials. The dielectric layer 134 can be deposited by CVD, ALD, PVD, or other suitable deposition processes. Other materials and processes can be utilized for the dielectric layer 134 without departing from the scope of the present disclosure. The integrated circuit 100 of FIG. 2I now fully corresponds to the integrated circuit 100 of FIG. 1A.

Figure 2J:
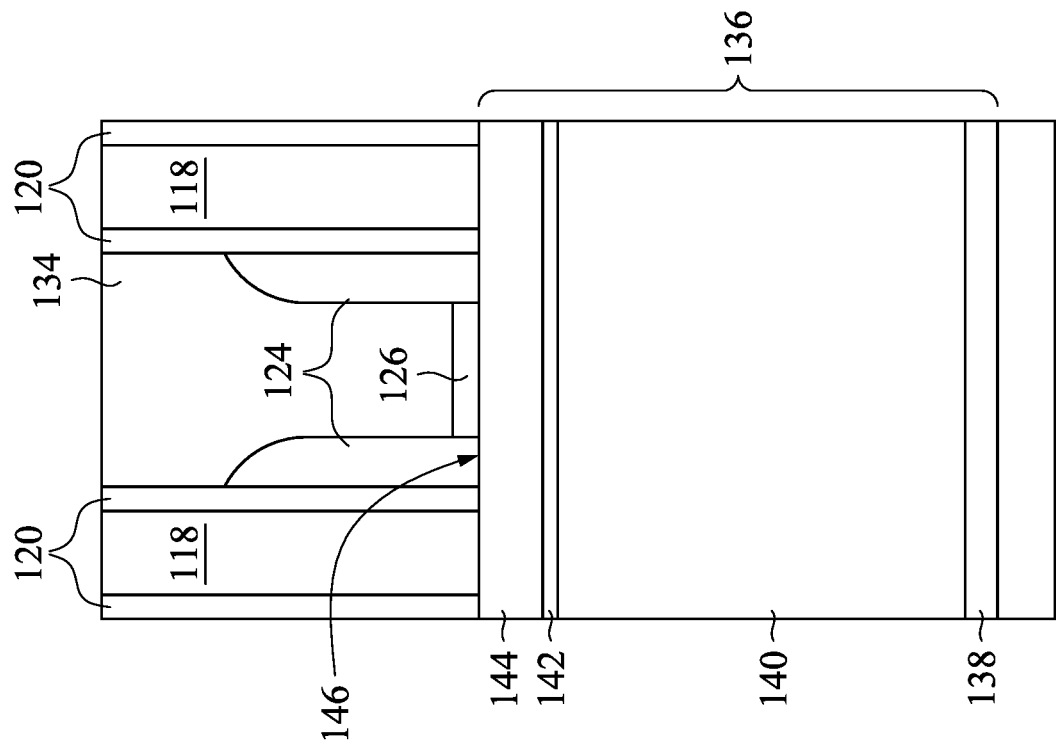

FIG. 2J is a cross-sectional view of the integrated circuit 100 taken along cut lines J from FIG. 2H. The integrated circuit 100 of FIG. 2J corresponds to the same stage of processing of the integrated circuit 100 of FIG. 2I. In particular, the source/drain contacts 118 have been formed between the dielectric layer 120 and extend across the hybrid fin structures 136. While cut lines 21 pass through the channels 104 and the gate metal 106, the cut lines 2J pass through the hybrid fin structure 136. The integrated circuit 100 of FIG. 2J fully corresponds to the integrated circuit 100 of FIG. 1B.

Figure 3:
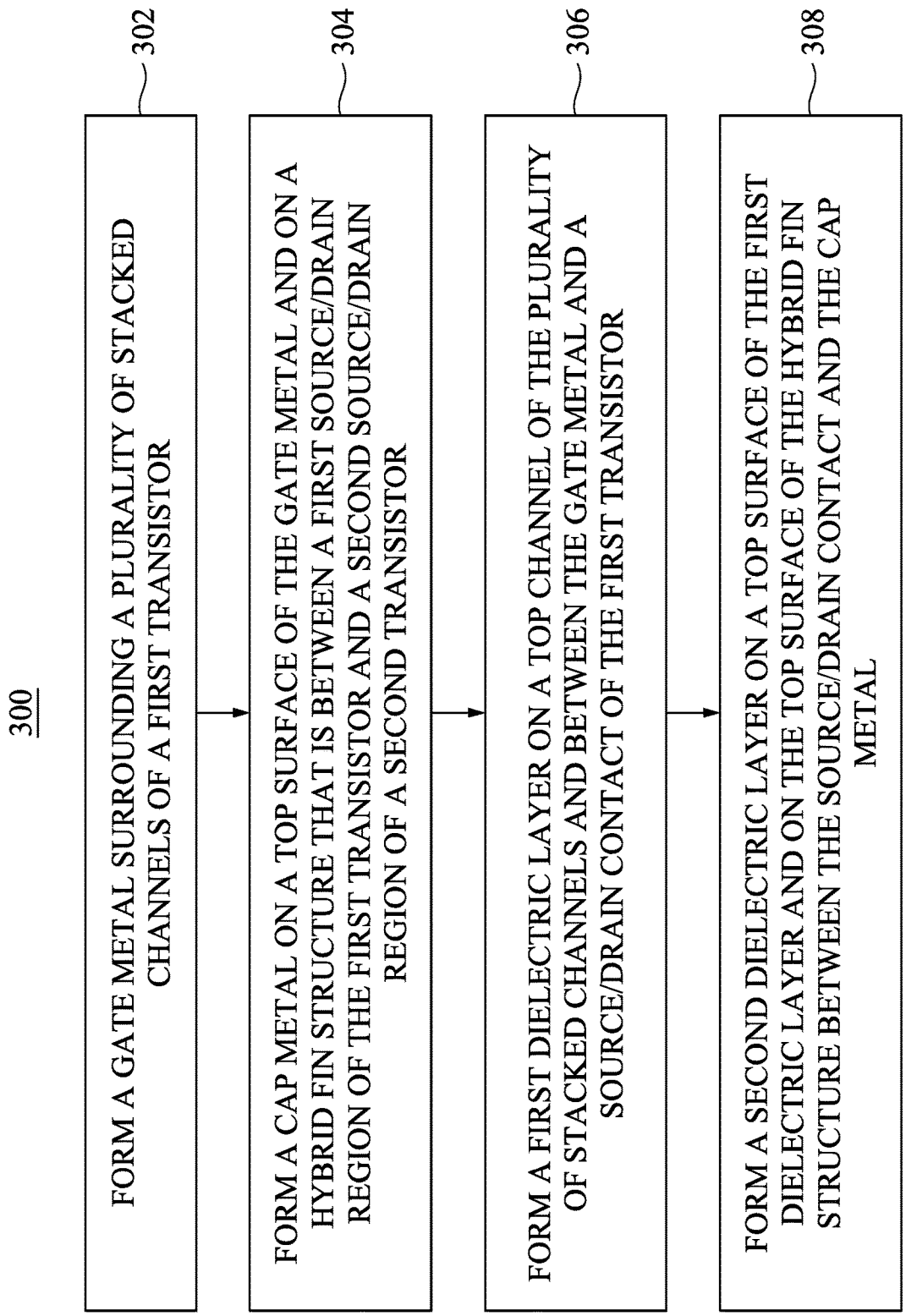
FIG. 3 is a flow diagram of a process for forming an integrated circuit, in accordance with some embodiments.

FIG. 3 is a flow diagram of a method 300 for forming an integrated circuit, in accordance with some embodiments. The method 300 can utilize processes, structures, or components described in relation to FIGS. 1-5. At 302, the method 300 includes forming a gate metal surrounding a plurality of stacked channels of a first transistor. One example of a gate metal is the gate metal 106 of FIG. 1A. One example of stacked channels are the channels 104 of FIG. 1A. One example of a transistor is the transistor 102 of FIG. 1A. At 304, the method 300 includes forming a cap metal on a top surface of the gate metal and on a hybrid fin structure that is between a first source/drain region of the first transistor and a second source/drain region of a second transistor. One example of a cap metal is the cap metal 106 of FIG. 1A. One example of a hybrid fin structure is the hybrid fin structure 136 of FIG. 1B. One example of a first source/drain region is the source/drain region 108 of FIG. 1A. One example of second transistor is one of the transistors 102 of FIG. 2H. One example of a source region is the source region 108 of the one of the transistors 102 of FIG. 2H. At 306, the method 300 includes forming a first dielectric layer on a top channel of the plurality of stacked channels and between the gate metal and a source/drain contact of the first transistor. One example of a first dielectric layer is the dielectric layer 122 of FIG. 1. One example of a source/drain contact is the source/drain contact 118 of FIG. 1A. At 308, the method 300 includes forming a second dielectric layer on a top surface of the first dielectric layer and on the top surface of the hybrid fin structure between the source/drain contact and the cap metal. One example of a second dielectric layer is the dielectric layer 124 of FIG. 1A.

Embodiments of the present disclosure provide an integrated circuit with nanosheet transistors. Each transistor includes a plurality of stacked channels and a gate metal surrounding the stacked channels. Each transistor includes a source/drain region in contact with the stacked channels. Each transistor includes a source/drain contact over and electrically connected to the source/drain region. A first dielectric spacer layer is positioned between the gate metal and the source/drain contact. A cap metal is positioned on the gate metal and extends across a hybrid fin structure to connect the gate metal to the gate metal of another transistor. A second dielectric layer is positioned on the first dielectric layer. The second dielectric spacer layer is positioned between the cap metal and the source/drain contact over the gate metal and over the hybrid fin structure. The second dielectric spacer layer is a low-K dielectric layer.

This structure provides many benefits. The low-K second dielectric layer is used in place of high-K dielectric materials that were previously removed. The result is that parasitic capacitance is greatly reduced between the source/drain contact and the cap metal, and between adjacent source/drain contacts. This provides for faster switching of transistor states and improved characteristics of electrical signals in the source/drain contact and the cap metal.

In some embodiments, an integrated circuit includes a transistor. The transistor includes a plurality of stacked channels, a source/drain region in contact with each of the stacked channels, and a source/drain contact over the source/drain region. The transistor includes a gate metal surrounding the stacked channels, a gate dielectric between the gate metal and the stacked channels, and a first dielectric layer between the gate metal and the source/drain contact and having a top surface substantially coplanar with a top surface of the gate metal.

In some embodiments, an integrated circuit includes a transistor including a source/drain region, a hybrid fin structure adjacent to the source/drain region, and a first source/drain contact over the source/drain region and the hybrid fin structure. The integrated circuit includes a first dielectric layer on a sidewall of the source/drain contact, a cap metal on a top surface of the hybrid fin structure, and a second dielectric layer on the top surface of the hybrid fin structure and between and in contact with the first dielectric layer and the cap layer, wherein the second dielectric layer has a dielectric constant less than 10.

In some embodiments, a method includes forming a gate metal surrounding a plurality of stacked channels of a first transistor and forming a cap metal on a top surface of the gate metal and on a hybrid fin structure that is between a first source/drain region of the first transistor and a second source/drain region of a second transistor. The method includes forming a first dielectric layer on a top channel of the plurality of stacked channels and between the gate metal and a source/drain contact of the first transistor and forming a second dielectric layer on a top surface of the first dielectric layer and on the top surface of the hybrid fin structure between the source/drain contact and the cap metal.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. An integrated circuit, comprising:
   a transistor, including:
   a plurality of stacked channels;
   a source/drain region in contact with each of the stacked channels;
   a source/drain contact over the source/drain region;
   a gate metal surrounding the stacked channels;
   a gate dielectric between the gate metal and the stacked channels;
   a first dielectric layer between the gate metal and the source/drain contact and having a top surface substantially coplanar with a top surface of the gate metal;
   a hybrid fin structure adjacent to the source/drain region;
   a second dielectric layer on a top surface of the first dielectric layer and on a top surface of the hybrid fin structure; and
   a cap metal on the top surface of the gate metal and on the top surface of the hybrid fin structure, wherein the second dielectric layer is between the cap metal and the source/drain contact.

2. The integrated circuit of claim 1, wherein the cap metal is on a top surface of the gate dielectric.

3. The integrated circuit of claim 1, further comprising:
   a third dielectric layer on the top surface of the source/drain region and on a sidewall of the source/drain contact, the third dielectric layer in contact with the first dielectric layer and the second dielectric layer.

4. The integrated circuit of claim 3, wherein the third dielectric layer extends higher than the second dielectric layer.

5. The integrated circuit of claim 4, further comprising a fourth dielectric layer on a sidewall of the third dielectric layer, over the second dielectric layer, and having a top surface substantially coplanar with a top surface of the third dielectric layer.

6. The integrated circuit of claim 1, further comprising:
   a third dielectric layer on the top surface of the source/drain region, on a top surface of the hybrid fin structure, and on a sidewall of the source/drain contact, the third dielectric layer in contact with the first dielectric layer and the second dielectric layer, wherein the second dielectric layer has a lower dielectric constant than the gate dielectric, wherein the second dielectric layer is between and in contact with the cap metal and the third dielectric layer on the top surface of the hybrid fin structure.

7. The integrated circuit of claim 6, wherein the gate dielectric includes hafnium oxide, wherein the second dielectric layer is selected from a group including silicon nitride, silicon oxide, silicon carbonitride, silicon oxynitride, and silicon oxycarbonitride.

8. The integrated circuit of claim 1, wherein a top surface of the first dielectric layer is substantially coplanar with a top surface of the gate dielectric.

9. An integrated circuit, comprising:
a transistor including a source/drain region;
a hybrid fin structure adjacent to the source/drain region;
a first source/drain contact over the source/drain region and the hybrid fin structure;
a first dielectric layer on a sidewall of the source/drain contact;
a cap metal on a top surface of the hybrid fin structure; and
a second dielectric layer on the top surface of the hybrid fin structure and between and in contact with the first dielectric layer and the cap metal, wherein the second dielectric layer has a dielectric constant less than 10.

10. The integrated circuit of claim 9, wherein the transistor includes:
a plurality of stacked channels in contact with the source/drain region;
a gate metal surrounding the stacked channels, wherein the cap metal is on a top surface of the gate metal; and
a third dielectric layer on a top surface of a top channel of the plurality of stacked channels and between the gate metal and the first dielectric layer, wherein the second dielectric layer is over the first dielectric layer.

11. The integrated circuit of claim 10, wherein a top surface of the third dielectric layer is substantially coplanar with a top surface of the gate metal.

12. The integrated circuit of claim 9, wherein the second dielectric layer is selected from a group including silicon nitride, silicon oxide, silicon carbonitride, silicon oxynitride, and silicon oxycarbonitride.

13. The integrated circuit of claim 9, further comprising a second transistor including a second source/drain region, wherein the hybrid fin structure is between the first source/drain region and the second source/drain region.

14. A method, comprising:
forming a gate metal surrounding a plurality of stacked channels of a first transistor;
forming a cap metal on a top surface of the gate metal and on a hybrid fin structure that is between a first source/drain region of the first transistor and a second source/drain region of a second transistor;
forming a first dielectric layer on a top channel of the plurality of stacked channels and between the gate metal and a source/drain contact of the first transistor; and
forming a second dielectric layer on a top surface of the first dielectric layer and on the top surface of the hybrid fin structure between the source/drain contact and the cap metal.

15. The method of claim 14, further comprising forming a top surface of the first dielectric layer substantially coplanar with a top surface of the gate electrode prior to forming the second dielectric layer.

16. The method of claim 14, further comprising forming the second dielectric layer prior to forming the cap metal.

17. The method of claim 14, further comprising forming the top surface of the gate metal substantially coplanar with the top surface of the hybrid fin structure by performing a planarization process prior to depositing the second dielectric layer.

18. The method of claim 17, wherein the first dielectric layer is a spacer layer for the gate metal and the source/drain contact.

19. The method of claim 14, comprising forming a third dielectric layer on a sidewall of the source/drain contact.

20. The method of claim 19, wherein the third dielectric layer is in contact with the first dielectric layer and the second dielectric layer.

* * * * *